(12) United States Patent
Galbraith et al.

(10) Patent No.: US 11,164,650 B2
(45) Date of Patent: Nov. 2, 2021

(54) SCRUB MANAGEMENT IN STORAGE CLASS MEMORY

(71) Applicant: International Business Machines Corporation, Armonk, NY (US)

(72) Inventors: Robert Edward Galbraith, Rochester, MN (US); Damir Anthony Jamsek, Austin, TX (US); Andrew Kenneth Martin, Austin, TX (US); Daniel Frank Moertl, Rochester, MN (US); Charles Camp, Sugar Land, TX (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 16/556,981

(22) Filed: Aug. 30, 2019

(65) Prior Publication Data

US 2021/0065831 A1 Mar. 4, 2021

(51) Int. Cl.
*G11C 29/38* (2006.01)
*G11C 29/10* (2006.01)

(52) U.S. Cl.
CPC .............. *G11C 29/38* (2013.01); *G11C 29/10* (2013.01)

(58) Field of Classification Search
None
See application file for complete search history.

(56) References Cited

U.S. PATENT DOCUMENTS

| | | |
|---|---|---|
| 9,672,148 B1 | 6/2017 | Michaud et al. |
| 2013/0064026 A1 | 3/2013 | Chou et al. |
| 2013/0339570 A1* | 12/2013 | Franceschini ....... G06F 12/0246 711/102 |
| 2016/0328303 A1 | 11/2016 | Brandner et al. |
| 2017/0293527 A1 | 10/2017 | Shappir et al. |
| 2017/0364459 A1 | 12/2017 | Bandic et al. |
| 2018/0032337 A1 | 2/2018 | Coneski et al. |
| 2018/0081917 A1* | 3/2018 | Kishi .................... G06F 3/0683 |
| 2018/0189155 A1 | 7/2018 | Gunnam et al. |
| 2018/0196745 A1 | 7/2018 | Karr et al. |

(Continued)

OTHER PUBLICATIONS

Abadir, "Functional Testing of Semiconductor Random Access Memories", (1983), ACM, Computing Surveys, vol. 15, No. 3, pp. 175-198 (Year: 1983).*

(Continued)

*Primary Examiner* — April Y Blair
*Assistant Examiner* — Matthew W Wahlin
(74) *Attorney, Agent, or Firm* — Scully, Scott, Murphy & Presser, P.C.

(57) ABSTRACT

A method and system for collecting diagnostic data from a storage class memory chip is disclosed. The method includes performing a scrub process on at least a portion of the storage class memory by: removing the portion of the storage class memory from use, wherein the portion comprises a plurality of memory locations, executing a first write operation to write a first pattern on each of the plurality of memory locations, executing a first read operation to obtain a first set of data written on each of the plurality of memory locations, analyzing the first set of data written on each of the plurality of memory locations to determine the number of stuck-at faults in the portion, and updating one or more counters in an error rate table (ERT) to indicate the number of stuck-at faults.

20 Claims, 10 Drawing Sheets

(56) References Cited

U.S. PATENT DOCUMENTS

| | | |
|---|---|---|
| 2019/0103168 A1* | 4/2019 | Ghaly .................. G11C 29/42 |
| 2019/0164621 A1 | 5/2019 | Kim |
| 2019/0220391 A1* | 7/2019 | Simak .................. G06F 12/023 |
| 2019/0347015 A1 | 11/2019 | Luo et al. |

OTHER PUBLICATIONS

IBM, "What you should know about storage-class memory"—(May 2013) (Year: 2013).*
Office Action dated Oct. 2, 2020 received in U.S. Appl. No. 16/557,039, 10 pages.
List of IBM Patents or Patent Applications Treated As Related.

* cited by examiner

ERT Analysis indicates only bit array repair required

☒ = Stuck bit counts exceed $T_H$ threshold for BAI/beat
☒ = Stuck bit counts exceed $T_L$ threshold for BAI/beat
☒ = Acceptable stuck bit counts for BAI/beat

| Pkg = 0 | Beat=0 | Beat=1 | Beat=2 | ... | Beat=13 | Beat=14 | Beat=15 |
|---|---|---|---|---|---|---|---|
| BAI=0 | ☒ | ☒ | ☒ | | ☒ | | |
| BAI=1 | ☒ | ☒ | ☒ | | ☒ | ☒ | ☒ |
| BAI=2 | ☒ | ☒ | ☒ | | ☒ | ☒ | ☒ |
| ... | | | | | | | |
| BAI=125 | ☒ | ☒ | ☒ | | ☒ | ☒ | ☒ |
| BAI=126 | ☒ | ☒ | ☒ | | ☒ | ☒ | ☒ |
| BAI=127 | ☒ | ☒ | ☒ | | ☒ | ☒ | ☒ |

Determine 4 worst bit array indexes for each beat, and pick random bit array index for any "worst" bit array index with zero stuck faults No column (MRU) has more than 4 ☒ or ☒ bit array indexes, thus only bit array repair (BART update) needed

FIG. 6A

ERT Analysis indicates MRU replacement required

☒ = Stuck bit counts exceed $T_H$ threshold for BAI/beat
░ = Stuck bit counts exceed $T_L$ threshold for BAI/beat
☑ = Acceptable stuck bit counts for BAI/beat

| Pkg = 0 | Beat=0 | Beat=1 | Beat=2 | ... | Beat=13 | Beat=14 | Beat=15 |
|---|---|---|---|---|---|---|---|
| BAI=0 | ☑ | ☑ | ☑ | | ☑ | ☒ | ☑ |
| BAI=1 | ☒ | ☑ | ☑ | | ☑ | ░ | ☑ |
| BAI=2 | ☑ | ☑ | ☒ | | ☑ | ☒ | |
| ... | | | | | | | |
| BAI=125 | ☑ | ☑ | ☑ | | ☑ | ☒ | ☑ |
| BAI=126 | ☑ | ☑ | ☑ | | ☑ | ☒ | ☑ |
| BAI=127 | ☑ | ☑ | ☑ | | ☑ | ☒ | ☑ |

A column (MRU) has more than 4 ☒ bit array indexes, or more than 11 ░ / ☒ bit array indexes, thus MRU replacement (MRT update) needed Note: If no spare MRU/IRU is available then VRU may need to be converted into spares and not returned to service.

FIG. 6B

ERT Analysis indicates IRU replacement required

☒ = Stuck bit counts exceed $T_H$ threshold for BAI/beat
░ = Stuck bit counts exceed $T_L$ threshold for BAI/beat
▨ = Acceptable stuck bit counts for BAI/beat

| Pkg = 0 | Beat=0 | Beat=1 | Beat=2 | ... | Beat=13 | Beat=14 | Beat=15 |
|---|---|---|---|---|---|---|---|
| BAI=0 | ☒ | ☒ | ☒ | | ☒ | ☒ | ▨ |
| BAI=1 | ☒ | ☒ | ☒ | | ░ | ░ | ☒ |
| BAI=2 | ▨ | ☒ | ☒ | | ☒ | ☒ | ☒ |
| ... | | | | | | | |
| BAI=125 | ☒ | ▨ | ☒ | | ☒ | ☒ | |
| BAI=126 | ☒ | ☒ | ☒ | | ☒ | ☒ | ☒ |
| BAI=127 | ☒ | ☒ | ▨ | | ☒ | ☒ | ☒ |

All columns (MRUs) have more than 4 ☒ bit array indexes, or more than 11 ░ / ☒ bit array indexes, thus IRU replacement (CST update) needed
Note: If no spare IRU is available then VRU may need to be converted into spares and not returned to service.

FIG. 6C

SCRUB MANAGEMENT IN STORAGE CLASS MEMORY

BACKGROUND

The disclosure herein relates generally to scrub process and memory repair for storage class memory (SCM).

Storage class memory (SCM) is a type of persistent memory that combines the low latency and byte-addressability of dynamic read access memory (DRAM) with the non-volatility, areal density, and economical characteristics of traditional storage media. Furthermore, given the byte-addressability and low latency of SCM technologies, central processing units (CPU) can access data stored in SCM without buffering the data in DRAM. Consequently, SCM technologies blur the distinction between computer memory and traditional storage media, and enable single level architectures without DRAM. Unlike traditional main memory and disk storage configurations, SCM provides a single level architecture.

Typically, SCM is implemented as groups of solid state devices connected to a computing system via several input/output (I/O) adapters, which are used to map technology of an I/O device to the memory bus of the central processing unit(s). However, writing data to SCM requires paying attention to specifics in the SCM technology: an SCM media card is organized as a collection of packages that each include "N" number of dies with millions of bytes that are byte-addressable. One common characteristic of SCMs is that these memory devices have finite write endurance. A memory device with finite write endurance means that it cannot be written indefinitely before parts of the SCM start faulting. Identifying which memory is bad or error prone helps to decrease the risk of losing stored data. For example, memory bytes (or bit arrays) that are identified as bad may be avoided entirely while memory bytes that are not identified as bad may be used without restrictions. Furthermore, bad memory bytes in embodiments can be replaced with spare bytes.

SUMMARY

The summary of the disclosure is given to aid understanding of a computer system, computer architectural structure, processor, storage class memory (SCM), and method of media management, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the computer system, the architectural structure, processor, SCM and their method of operation to achieve different effects.

A method for collecting diagnostic data from a storage class memory chip is disclosed, the method including performing a scrub process on at least a portion of the storage class memory by: removing the portion of the storage class memory from use, wherein the portion comprises a plurality of memory locations; executing a first write operation to write a first pattern on each of the plurality of memory locations; executing a first read operation to obtain a first set of data written on each of the plurality of memory locations; analyzing the first set of data written on each of the plurality of memory locations to determine the number of stuck-at faults in the portion; and updating one or more counters in an error rate table (ERT) to indicate the number of stuck-at faults. In an embodiment, performing the scrub process further comprises: executing a second write operation to write a second pattern on each of the plurality of memory locations, wherein the first pattern and the second pattern are different from each other; executing a second read operation to obtain a second set of data written on each of the plurality of memory locations; analyzing the second set of data written on each of the plurality of memory locations to determine the number of stuck-at faults, and in an aspect the number of second stuck-at faults, in the portion; and updating one or more counters in the error rate table (ERT) to indicate the number of stuck-at faults, and in an aspect the number of second stuck-at faults. The method or process in one or more embodiments can be further performed with a third and/or fourth pattern. The method in an embodiment, further comprises returning the portion of the storage class memory into service for use during read/write operations after the scrub process.

In one or more embodiments, the first pattern is one of a repeating string of 1's or a repeating string of 0's and the second pattern is another different one of the repeating string of 0's or the repeating string of 1's. The stuck-at faults can include at least one of the following: stuck-at-0, stuck-at-1, stuck-at-X, or at least two bits stuck together. Removing the portion of the storage class memory from use in one or more embodiments can include removing the portion from a Free List corresponding to the storage class memory, and/or transferring data stored on the portion of the storage class memory to a second portion of the storage class memory. In an embodiment, the ERT comprises counters for counting stuck-at faults corresponding to each of the plurality of bit arrays for each of the plurality of memory locations. The plurality of memory locations in the portion of the storage class memory in an aspect are addressable by a threshold number of consecutive virtual block addresses of the storage class memory. The method in an aspect also includes analyzing the ERT to identify one or more of the plurality of bit arrays not to be used for performing read/write operations, wherein the one or more of the plurality of bit arrays not to be used for performing read/write operations have counter values for the number of stuck-at faults greater than a threshold value.

A computing system for collecting diagnostic data from a storage class memory chip is also disclosed, the system including a processor; and a computer readable storage medium comprising programming instructions that when executed cause the processor to perform a scrub process on at least a portion of a storage class memory by: removing the portion of the storage class memory from use, wherein the portion comprises a plurality of memory locations; executing a first write operation to write a first pattern on each of the plurality of memory locations; executing a first read operation to obtain a first set of data written on each of the plurality of memory locations; analyzing the first set of data written on each of the plurality of memory locations to determine the number of stuck-at faults in the portion; and update one or more counters in an error rate table (ERT) to indicate the number of stuck-at faults. The system in an embodiment further includes programming instructions to cause the processor to perform the scrub process by: executing a second write operation to write a second pattern on each of the plurality of memory locations, wherein the first pattern and the second pattern are different from each other; executing a second read operation to obtain a second set of data written on each of the plurality of memory locations; analyzing the second set of data written on each of the plurality of memory locations to determine the number of stuck-at faults, preferably the number of second stuck-at faults, in the portion; and updating one or more counters in the error rate table (ERT) to indicate the number of stuck-at faults, an in an aspect the number of second stuck-at faults. In an embodiment, each of the plurality of memory locations comprise a plurality of bit arrays, each of the plurality of bit arrays in an embodiment including about 1 million bits.

The foregoing and other objects, features and advantages of the invention will be apparent from the following more particular descriptions of exemplary embodiments of the invention as illustrated in the accompanying drawings wherein like reference numbers generally represent like parts of illustrative embodiments of the invention.

BRIEF DESCRIPTION OF THE DRAWINGS

The various aspects, features and embodiments of a computer system, computer architectural structure, processor, memory system, and their method of operation will be better understood when read in conjunction with the figures provided. Embodiments are provided in the figures for the purpose of illustrating aspects, features, and/or various embodiments of the computer system, computer architectural structure, processors, SCM102, and their method of operation, but the claims should not be limited to the precise arrangement, structures, features, aspects, assemblies, subassemblies, systems, circuitry, embodiments, methods, processes, techniques, and/or devices shown, and the arrangements, structures, systems, assemblies, subassemblies, features, aspects, methods, processes, techniques, circuitry, embodiments, and devices shown may be used singularly or in combination with other arrangements, structures, assemblies, subassemblies, systems, features, aspects, circuitry, embodiments, methods, techniques, processes, and/or devices.

FIGS. 6A, 6B and 6C illustrate example scenarios for different types of memory repair actions of the memory system of FIGS. 2A and 2B.

DETAILED DESCRIPTION

The following description is made for illustrating the general principles of the invention and is not meant to limit the inventive concepts claimed herein. In the following detailed description, numerous details are set forth in order to provide an understanding of the computer system, computer architectural structure, processor, caches, memory systems and their method of operation, however, it will be understood by those skilled in the art that different and numerous embodiments of the computer system, computer architectural structure, processor, caches, memory systems and their method of operation may be practiced without those specific details, and the claims and disclosure should not be limited to the arrangements, structures, systems, assemblies, subassemblies, circuitry, features, aspects, processes, methods, techniques, embodiments, and/or details specifically described and shown herein. Further, particular features, aspects, arrangements, systems, embodiments, techniques, etc. described herein can be used in combination with other described features, aspects, arrangements, systems, embodiments, techniques, etc. in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification and claims, specify the presence of stated features, integers, aspects, arrangements, embodiments, structures, systems, assemblies, subassemblies, steps, operations, elements, and/or components, but do not preclude the presence or addition of one or more other features, integers, aspects, arrangements, embodiments, structures, systems, assemblies, subassemblies, steps, operations, elements, components, and/or groups thereof.

The following discussion omits or only briefly describes conventional features of information processing systems, including processors and microprocessor systems and architectures, as well as address translation techniques and systems, which should be apparent to those skilled in the art. It is assumed that those skilled in the art are familiar with the general architecture of processors, and in particular with address translation techniques and systems, and their operation. It may be noted that a numbered element is numbered according to the figure in which the element is introduced, and is typically referred to by that number throughout succeeding figures.

Figure 1:
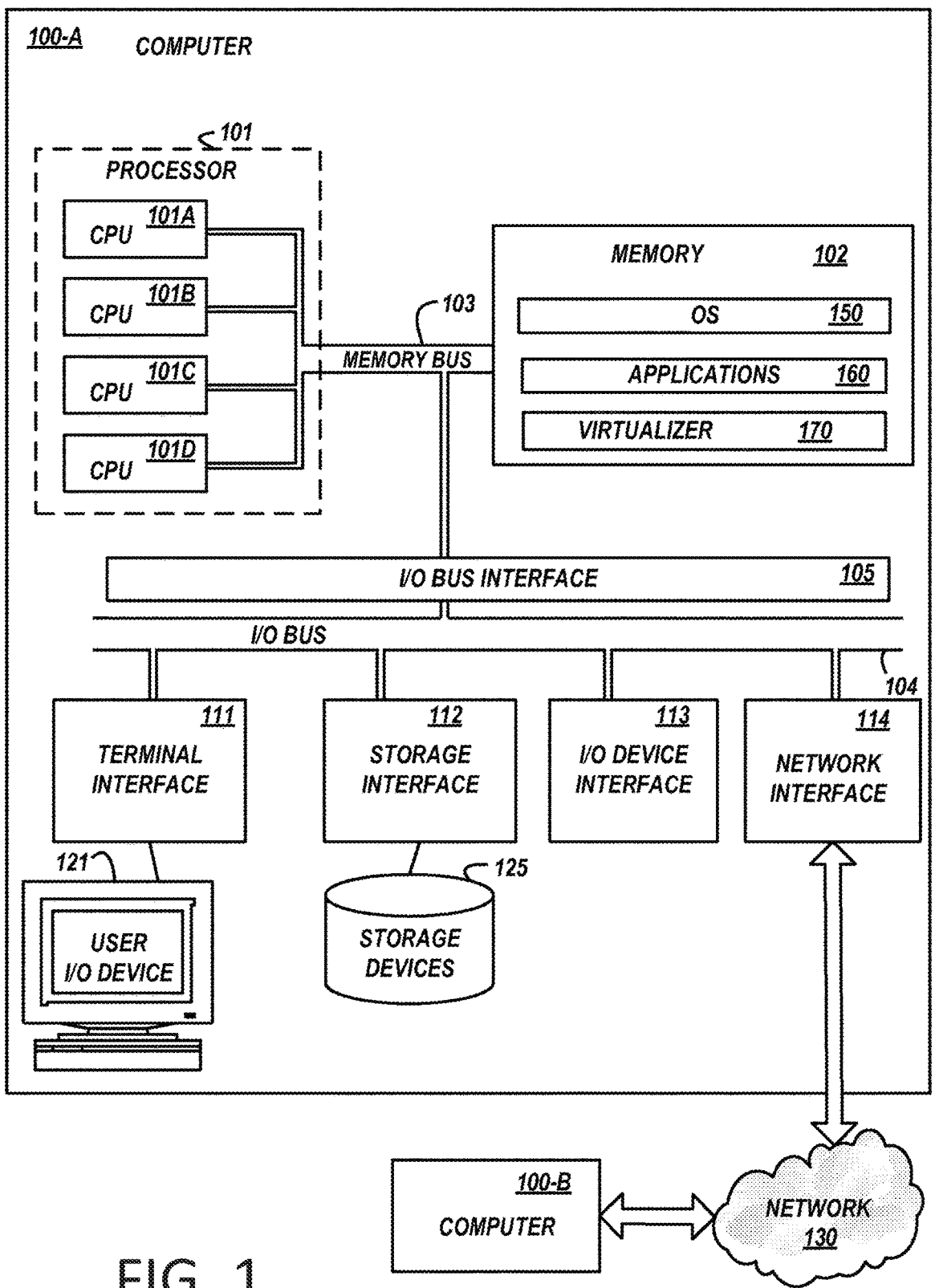
FIG. 1 is a functional block diagram illustrating a computer system, according to embodiments of the present disclosure.

FIG. 1 depicts a high-level block diagram representation of a computer 100-A connected to another computer 100-B via a network 130, according to an embodiment of the present invention. The term "computer" is used herein for convenience only, and in various embodiments is a more general data handling system, such as a mobile phone, tablet, server computer, etc. The mechanisms and apparatus of embodiments of the present invention apply equally to any appropriate data handling system.

The major components of the computer 100 may comprise one or more processors 101, a main memory system 102, a terminal interface 111, a storage interface 112, an I/O (Input/Output) device interface 113, and a network adapter or interface 114, all of which are communicatively coupled, directly or indirectly, for inter-component communication via a memory bus 103, an I/O bus 104, and an I/O bus interface unit 105. The computer 100 contains one or more general-purpose programmable central processing units (CPUs) 101A, 101B, 101C, and 101D, herein generically referred to as the processor 101. In an embodiment, the computer 100 contains multiple processors typical of a relatively large system; however, in another embodiment the computer 100 may alternatively be a single CPU system.

Each processor 101 executes instructions stored in the main memory system 102 and may comprise one or more levels of on-board cache.

In an embodiment, the main memory system 102 may comprise a random-access semiconductor memory (e.g., a DRAM, an SCM, or both), storage device, or storage medium for storing or encoding data and programs. In another embodiment, the main memory system 102 represents the entire virtual memory of the computer 100, and may also include the virtual memory of other computer systems coupled to the computer 100 or connected via the network 130. The main memory system 102 is conceptually a single monolithic entity, but in other embodiments the main memory system 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory system 102 stores or encodes an operating system (OS) 150, an application 160, and/or other program instructions. Although the operating system (OS) 150, application 160, etc. are illustrated as being contained within the memory system 102 in the computer 100, in other embodiments some or all of them may be on different computer systems and may be accessed remotely, e.g., via the network 130. The computer 100 may use virtual addressing mechanisms that allow the programs of the computer 100 to behave as if they only have access to a large, single storage entity instead of access to multiple, smaller storage entities. Thus, while operating system 150, application 160, or other program instructions are illustrated as being contained within the main memory system 102, these elements are not necessarily all completely contained in the same storage device at the same time. Further, although operating system 150, application 160, other program instructions, etc. are illustrated as being separate entities, in other embodiments some of them, portions of some of them, or all of them may be packaged together.

In an embodiment, operating system 150, application 160, and/or other program instructions comprise instructions or statements that execute on the processor 101 or instructions or statements that are interpreted by instructions or statements that execute on the processor 101, to carry out the functions as further described below. When such program instructions are able to be run by the processor 101, such computer 100 becomes a particular machine configured to carry out such instructions. For example, instructions for a memory mirroring application 160A may be loaded upon one or more computers 100A that causes the computer 100A to mirror the memory system 102 into a first portion and into a redundant second portion. In another example, memory system 102 may be mirrored by operating system 150. In another example, memory system 102 may be mirrored by a virtualizer application 170, such as a hypervisor.

One or more processors 101 may function as a general-purpose programmable graphics processor unit (GPU) that builds images (e.g. a GUI) for output to a display. The GPU, working in conjunction with one or more applications 160, determines how to manipulate pixels on, for example, a display, touch screen, etc. to create a display image or user interface. Ultimately, the image (e.g., GUI, etc.) is displayed to a user. The processor 101 and GPU may be discrete components or may be integrated into a single component.

The memory bus 103 provides a data communication path for transferring data among the processor 101, the main memory system 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The I/O interface units support communication with a variety of storage and I/O devices. For example, the terminal interface unit 111 supports the attachment of one or more user I/O devices 121, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 121 and the computer 100, and may receive output data via the user output devices. For example, a user interface may be presented via the user I/O device 121, such as displayed on a display device, played via a speaker, or printed via a printer. The user interface may be a user interface that provides content to a user visually (e.g. via a screen), audibly (e.g. via a speaker), and/or via touch (e.g. vibrations, etc.). In some embodiments, the computer 100 itself acts as the user interface as the user may move the computer 100 in ways to interact with, input, or manipulate computer application 160 data, function, etc.

The storage interface unit 112 supports the attachment of one or more local disk drives or secondary storage devices 125. In an embodiment, the secondary storage devices 125 are rotating magnetic disk drive storage devices, but in other embodiments they are arrays of disk drives configured to appear as a single large storage device to a host computer, or any other type of storage device. The contents of the main memory system 102, or any portion thereof, may be stored to and retrieved from the secondary storage devices 125, as needed. The local secondary storage devices 125 typically have a slower access time than does the memory system 102, meaning that the time needed to read and/or write data from/to the memory system 102 is less than the time needed to read and/or write data from/to for the local secondary storage devices 125.

The I/O device interface 113 provides an interface to any of various other input/output devices or devices of other types, such as printers or fax machines. The network adapter 114 provides one or more communications paths from the computer 100 to other data handling devices such as numerous other computers; such paths may comprise, e.g., one or more networks 130. Although the memory bus 103 is shown in FIG. 2 as a relatively simple, single bus structure providing a direct communication path among the processors 101, the main memory system 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 105 and the I/O bus 104 are shown as single respective units, the computer 100 may, in fact, contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

I/O interface 113 may contain electronic components and logic to adapt or convert data of one protocol on I/O bus 104 to another protocol on another bus. Therefore, I/O interface 113 may connect a wide variety of devices to computer 100 and to each other such as, but not limited to, tape drives, optical drives, printers, disk controllers, other bus adapters, PCI adapters, workstations using one or more protocols including, but not limited to, Token Ring, Gigabyte Ethernet, Ethernet, Fibre Channel, SSA, Fiber Channel Arbitrated Loop (FCAL), Serial SCSI, Ultra3 SCSI, Infiniband, FDDI, ATM, 1394, ESCON, wireless relays, Twinax, LAN connections, WAN connections, high performance graphics, etc. Though shown as distinct entities, the multiple I/O interface units 111, 112, 113, and 114 or the functionality of the I/O interface units 111, 112, 113, and 114 may be integrated into a similar device.

In various embodiments, the computer 100 is a multi-user mainframe computer system, a single-user system, a server computer, storage system, or similar device that has little or no direct user interface, but receives requests from other computer systems (clients). In other embodiments, the computer 100 is implemented as a desktop computer, portable computer, laptop or notebook computer, tablet computer, pocket computer, telephone, smart phone, pager, automobile, teleconferencing system, appliance, or any other appropriate type of electronic device.

The network 130 may be any suitable network or combination of networks and may support any appropriate protocol suitable for communication of data and/or code to/from the computer 100A and at least the computer 100B. In various embodiments, the network 130 may represent a data handling device or a combination of data handling devices, either connected directly or indirectly to the computer 100. In another embodiment, the network 130 may support wireless communications. In another embodiment, the network 130 may support hard-wired communications, such as a telephone line or cable. In another embodiment, the network 130 may be the Internet and may support IP (Internet Protocol). In another embodiment, the network 130 is implemented as a local area network (LAN) or a wide area network (WAN). In another embodiment, the network 130 is implemented as a hotspot service provider network. In another embodiment, the network 130 is implemented on an intranet. In another embodiment, the network 130 is implemented as any appropriate cellular data network, cell-based radio network technology, or wireless network. In another embodiment, the network 130 is implemented as any suitable network or combination of networks. Although one network 130 is shown, in other embodiments any number of networks (of the same or different types) may be present.

FIG. 1 is intended to depict the representative major components of the computer 100. But, individual components may have greater complexity than represented in FIG. 1, components other than or in addition to those shown in FIG. 1 may be present, and the number, type, and configuration of such components may vary. Several particular examples of such additional complexity or additional variations are disclosed herein; these are by way of example only and are not necessarily the only such variations. The various program instructions implementing, for example, upon computer system 100 according to various embodiments of the invention may be implemented in a number of manners, including using various computer applications, routines, components, programs, objects, modules, data structures, etc.

Embodiments of the present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a SCM, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the figures illustrate exemplary architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2A:
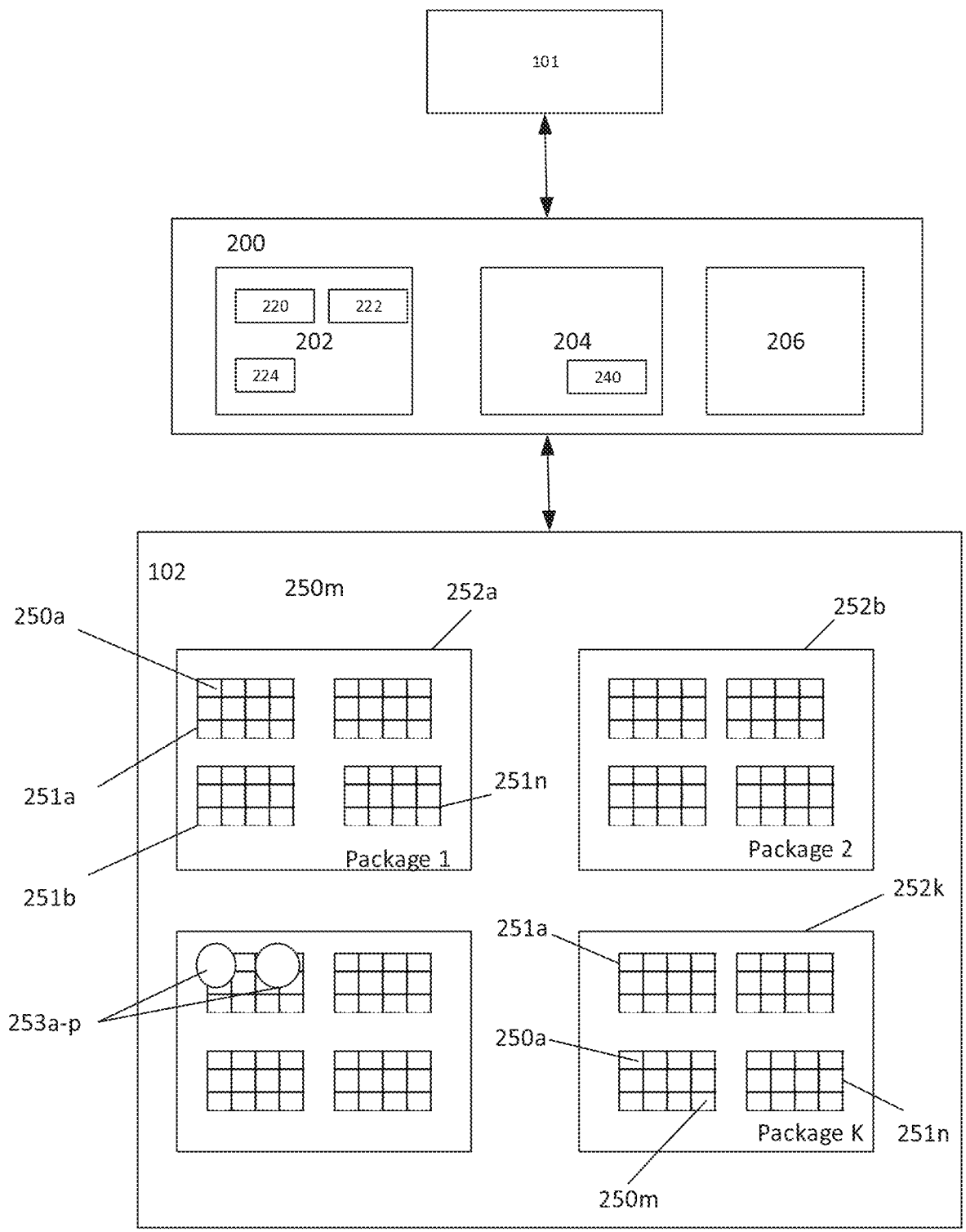
FIG. 2A is a functional block diagram illustrating an example memory system and controller, according to embodiments of the present disclosure.

Referring now to FIG. 2A, a schematic block diagram of an example memory system 102 in communication with the processor 101 via a memory controller 200 is illustrated. As shown in FIG. 2A, memory system 102 (e.g., an SCM media card) is configured to store data in a plurality "K" of packages, (i.e., chips) 252a-k (e.g., K=24), and each package includes a plurality "N" dies 251a-n (e.g., N=16). Each package in an embodiment can include the same number "N" of dies (e.g., N=8, 16, etc.). Each of dies 251a-n includes a number "M" of memory cells, in particular memory cells 250a-m. Furthermore, a number of the memory cells 250 in each die may be grouped into a number "X" of media replacement unit (MRU) groups 253a-p, each die including a fixed number of MRUs groups 253. For example, there could be 16 (X=16) MRU groups in a die 251.

Figure 2B:
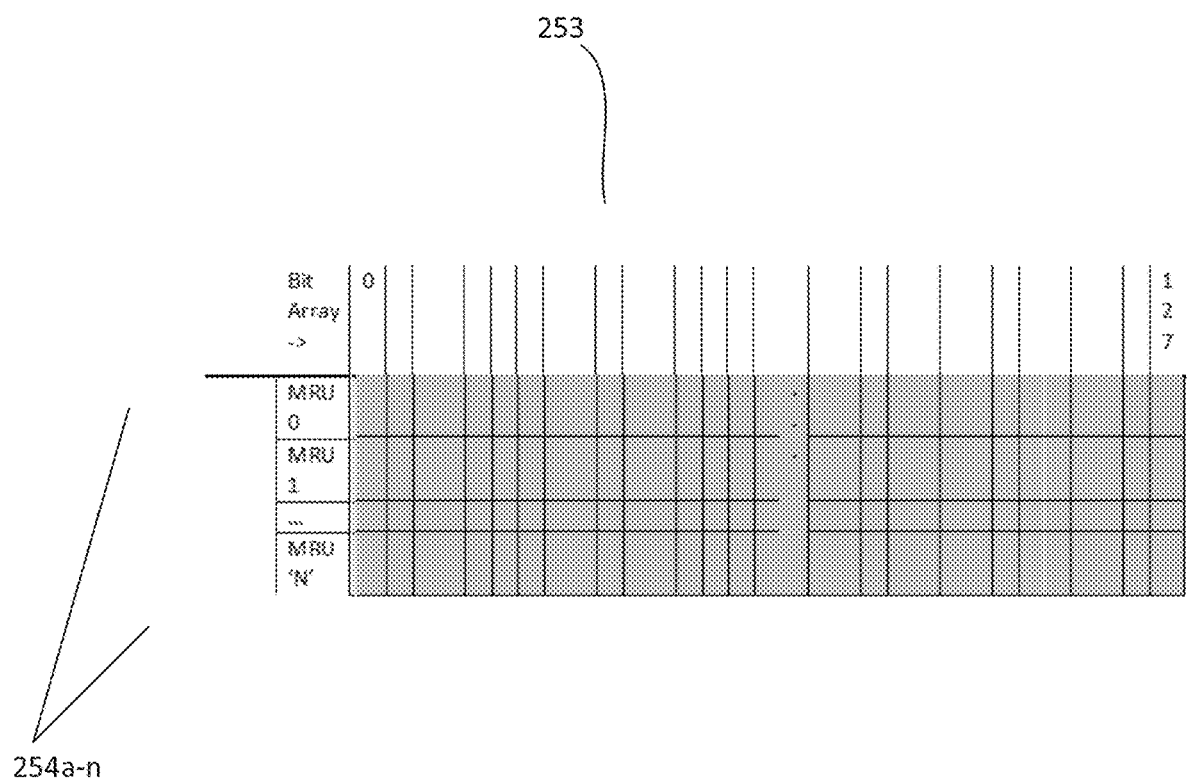
FIG. 2B depicts an example structure of the memory system of FIG. 2A.

Further, as shown in FIG. 2B, each MRU group 253a-p may comprise a plurality of MRUs 254a-n, each MRU comprising a plurality "B" of bit arrays, and each bit in a bit array comprising a memory cell. That is, as shown in FIG. 2B, a MRU group in an embodiment is split into 128 columns referred to as a bit array. The MRU group is split horizontally into rows called MRUs. Each MRU has 128 bit arrays. Each box in FIG. 2B can be a bit array of 1 million bits. Furthermore, each MRU includes "P" number of pages, where a page is the unit of data that can be written or read in the SCM (e.g., 16 bytes or 128 bits). In an embodiment, an MRU can contain 1 M pages. A page uses a bit from the active bit arrays during a read-write operation. The number of active bit arrays from which each page takes a memory cell may depend upon the required redundancy of memory cells in the memory system 102 and/or the scrub process (as described below). For example, in each MRU, if four bit arrays are reserved as spares for swapping operations with failing/error-prone bit arrays, each page will include bits from the 124 active bit arrays of the 128 bit arrays during a read-write operation (128 bit arrays in MRU minus the 4 reserved bit arrays=124 active bit arrays). This means that a page can store 15.5 bytes of actual data. As described below, spare MRUs from all the MRU Groups and dies in a single package may replace failing MRUs in that package.

It should be noted that using 1 million bits (1024*1024) per bit array is a design choice for the example embodiments disclosed in this disclosure. However, the disclosure is not so limiting and any number of bits per bit array (e.g., 500,000, 2 million, 3 million, etc.) may be used. The number of bits per bit array is then used to determine the number of MRUs, and thus the size of the tables (e.g., the CST, the MRT, the BART, etc.)

The total capacity of the memory system 102 can be determined according to K*C (measured in bytes), where C is the capacity of each package. Out of the K packages of the memory system 102, some packages may be used to store the data, and the other or remaining packages may be used for error-correcting code (ECC) and metadata used for data management. The error correction code is used for correcting an error included in the data stored in the data area. Each memory system 102 (e.g., SCM media card) has I/O data with z-bit data width, and appropriate-sized address bits depending on the capacity. SCM may be, for example, Phase Change Memory (PCM), Resistive RAM (RRAM) or any suitable non-volatile storage.

While FIG. 2A illustrates the memory controller 200 as being located outside the memory system 102, the disclosure is not so limiting, and the controller 200 may be a part of the memory system 102. As illustrated in FIG. 2A, controller 200 may include at least one of an address translation module 202, a scrub module 204, and a media repair module 206. Modules 202, 204, and 206 may be implemented in software, firmware, hardware, or a combination of two or more of software, firmware, and hardware. In other examples, controller 200 may include additional modules or hardware units, or may include fewer modules or hardware units. Controller 200 may include a microprocessor, digital signal processor (DSP), application specific integrated circuit (ASIC), field programmable gate array (FPGA), or other digital logic circuitry.

The address translation module 202 may associate a logical block address (LBA) and/or a virtual block address (VBA) used by processor(s) 101 with a physical block address (PBA) of memory system 102 (as discussed below). For example, in response to address translation module 202 receiving an LBA from a processor as part of a read or write command, address translation module 202 may look-up the VBA via a Logical-to-Virtual Table (LVT), address translation module 202 may then determine a PBA of memory system 102 that corresponds with the received LBA. In some examples, address translation module 202 may use a tiered virtual-to-physical table structure (V2P) for performing the translation (as described below). For example, the address translation module 202 may include a chip select table (CST) 220, a media repair table (MRT) 222, and a bit array repair table (BART) 224.

The scrub module 204 may be configured for detecting and correcting failures or errors in the memory system 102. An error in memory may be caused by an alpha or other particle, or by a physical defect in a memory cell. As used herein, the term "scrubbing" generally refers to a process of detecting errors and correcting correctable errors in a memory system. The errors can include soft (or transient) errors as well as, in certain circumstances, hard errors. In various embodiments, memory scrubbing may use a process of detecting and correcting bit errors in memory as described below. In order to not disturb regular memory requests from the CPU and thus prevent decreasing performance, scrubbing may be done by taking particular parts of memory system 102 out of service for the scrub process (described below). As the scrubbing may consist of normal read and/or write operations, it may increase power consumption by the memory compared to a non-scrubbing operation. Therefore, scrubbing is not performed continuously but periodically, according to various embodiments. For many servers, the timing or period for the scrub may be configured in the BIOS setup program.

In certain embodiments, the scrub module 204 may include an error rate table (ERT) 240. The error rate table may be configured to store information relating to memory defects or errors in the memory system 102. In certain embodiments, an ERT may be assigned for each of the packages included in the memory system 102 (e.g., 24 ERTs for 24 packages of a media card).

The media repair module 206 may be configured for repairing errors or defects in the memory system 102 by analyzing the information stored in the ERT(s). For example, the media repair module 206 may create ERT summary tables, and cause the memory controller to perform appropriate corrective actions such as, without limitation, replacement of one or more failing parts of the memory system 102 with a properly functioning spare (e.g., replace faulty bit arrays, MRUs, MRU groups, dies, or packages with an appropriate spare); modification of the various translation tables; search for spare memory parts/locations; creation of spare memory parts/locations; rebalancing of spare memory parts/locations (to increase the likelihood of locating spares for future replacements). The media repair module 206 in an embodiment can be configured to account for functional correctness while avoiding replacements which could negatively affect performance of the memory system 102.

Figure 3A:
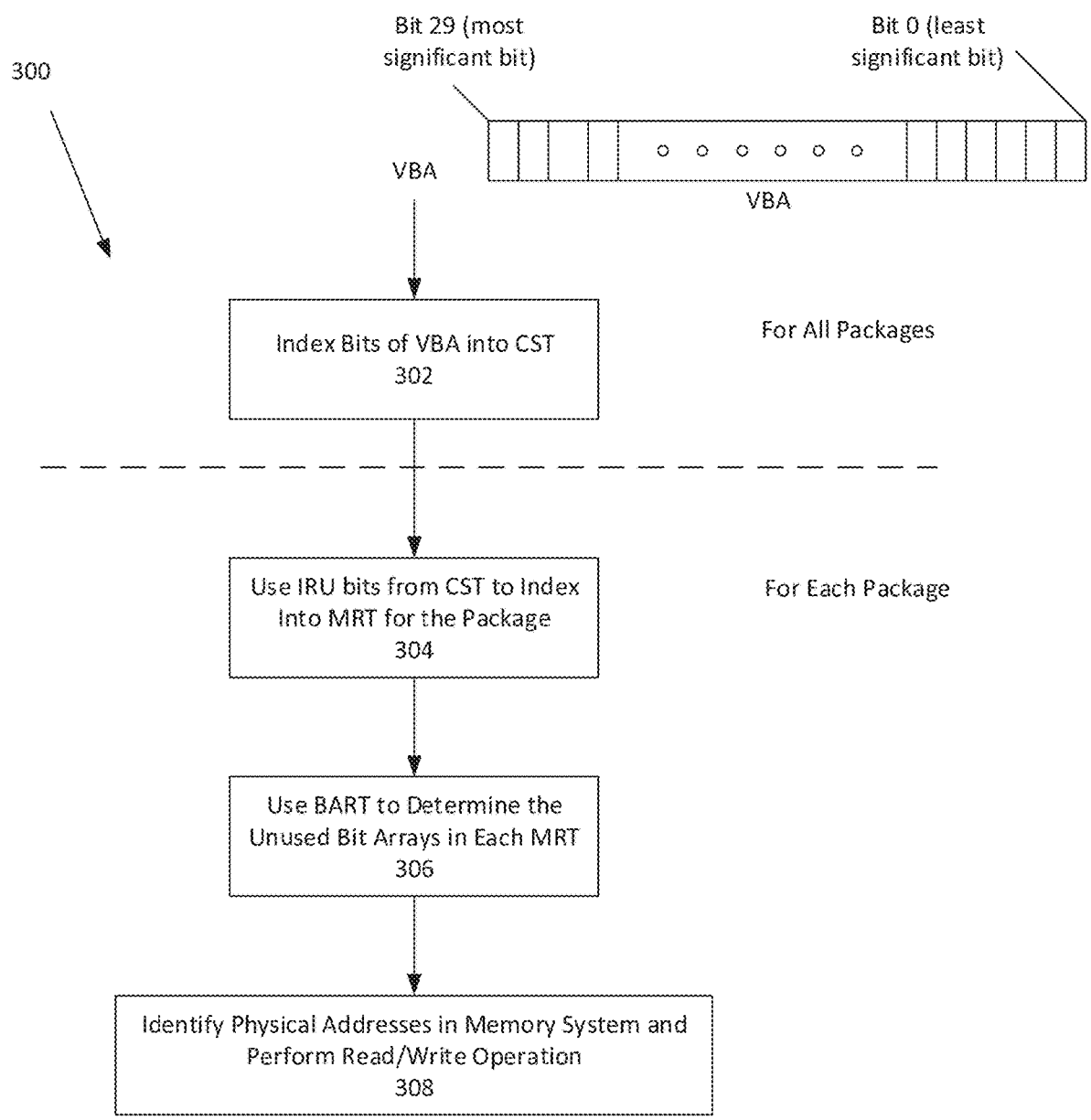
FIG. 3A is a flowchart illustrating an example method for translation of a virtual block address to a physical address of the memory system of FIGS. 2A and 2B.

Referring now to FIG. 3A, a flowchart illustrating an example translation of a virtual block address (VBA) to a physical address indicating the appropriate bits for performing a read/write operation (byte-addressable) on the memory system 102 of FIGS. 1, 2A, and 2B is illustrated. It will be understood to those skilled in the art that the VBA may be derived from a logical block address (LBA) received from the host using any now or hereafter known methods. The flowchart of FIG. 3A is based on the assumption that the lowest addressable granularity of the memory system 102 of FIG. 1 is 16 bytes, and the memory system 102 includes 24 packages, 8 or 16 dies per package, 16 MRU groups per die, 64 MRUs per MRU group, 128 bit arrays per MRU (4 of which are spare), 1 million bits in each bit array, and 1 million pages per MRU (each page including 128 bits, i.e., 16 bytes). It will be appreciated that the process of FIG. 1 can be utilized for other memory system configurations.

The flowchart further assumes that the read/write operation is performed for data that includes 4K byte size blocks of data. As such, each read/write operation is performed for a total of 5120 bytes of data that includes the 4K bytes of data received from the host, ECC bytes, and some metadata. Given that the lowest addressable granularity of the memory system 102 is 16 bytes, the 5120 bytes of data may be stored in 320 discrete pages (16 bytes each, with 15.5 bytes used to hold actual data) across the memory system 102. It will be understood that the 320 discrete pages should be distributed evenly across the memory system 102 for wear leveling. Therefore, the translation process translates the VBA to 320 discrete pages of the physical address in the memory system 102 and the VBA is representative of such 320 discrete pages. The VBA is a 30 bit address and the lower 20 bits (i.e., least significant bits) of the VBA are ignored during translation because they represent a collection of 1 million 4K byte sized blocks that all have the same upper 10 bits or most significant bits of the VBA (collectively, the 1 million 4K byte sized blocks are referred to as a virtual repair unit (VRU) represented by the VBA). It should be noted that the example embodiment disclosed herein uses a 30 bit VBA for addressing a 4 TB media card. However, the disclosure is not so limiting and other size addresses may be similarly used for different media cards. The upper 10 bits may be used to identify a VRU using the chip select table, as discussed below. The number of VRUs is configured based on the actual media card (for example, if the actual storage capacity of a 4 TB media card is about 2.5 TB, the number of VRUs is 614). For different media cards, different upper bits may be used to identify a VRU using the chip select table (CST).

As shown in FIG. 3A, the translation of a VBA to a physical address is a multiple layer lookup that includes at least three lookup tables—a chip select table (CST)(e.g., same for all 24 packages), 24 media repair tables (MRT) (e.g., one for each package), and 24 bit array repair tables (BART)(e.g., one for each package). As discussed above, the lower 20 bits of the VBA representing a VRU are ignored during translation and only the upper 10 bits of the VBA are indexed into the CST at step 302.

Figure 3B:
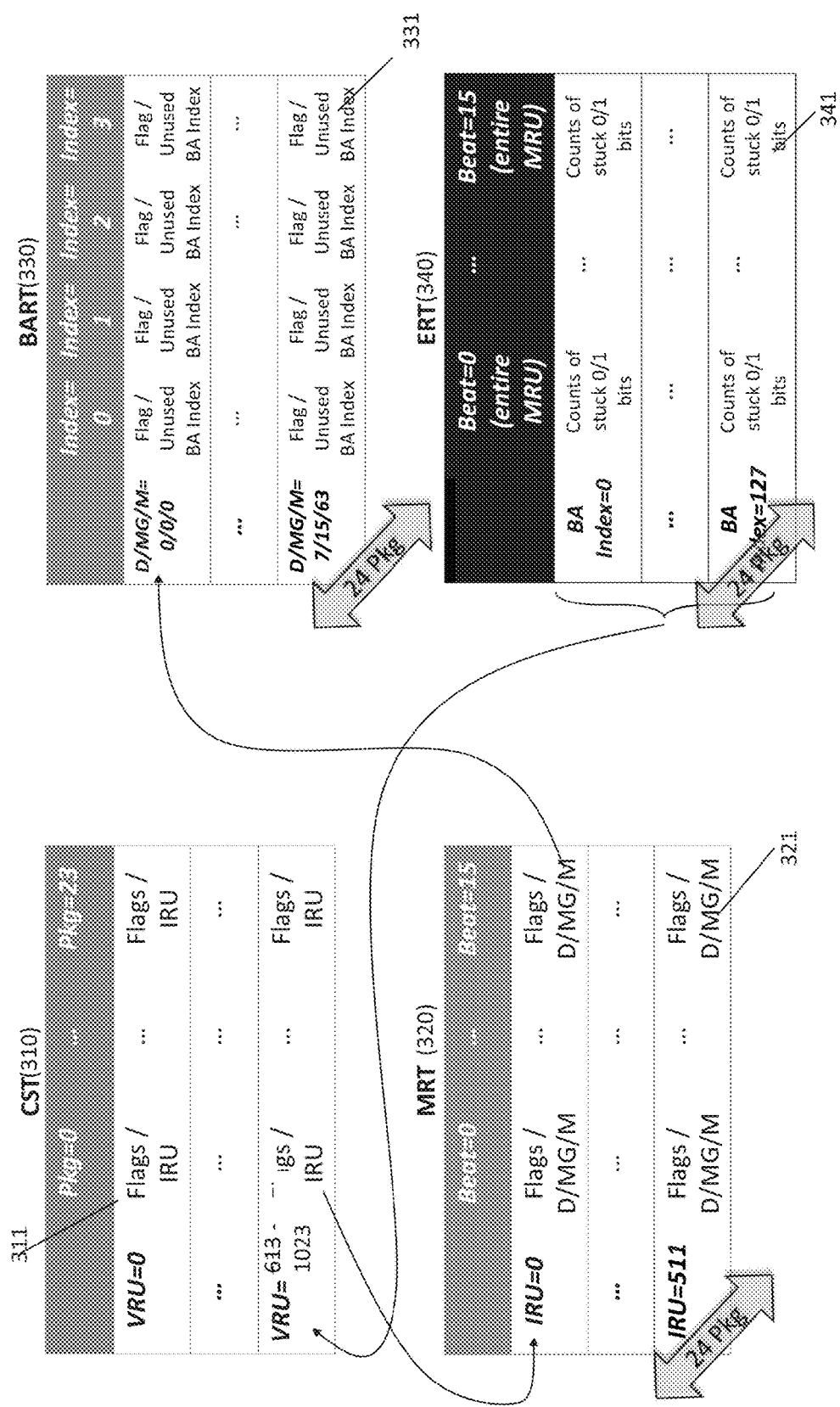
FIG. 3B illustrates example translation tables for use in translation of a virtual block address to a physical address of the memory system of FIGS. 2A and 2B.

As shown in FIG. 3B, CST 310 includes columns indexed by the package number, and rows indexed by the VRU number. The VRU number is identified using the upper 10 bits of the VBA. Each entry 311 in the CST 310 includes a total of 16 bits: the least significant 9 bits for determining the intermediate repair unit (IRU) number (i.e., 9 IRU bits), the next 3 bits are reserved for future use, the next 1 bit indicating whether the VRU is to be scrubbed (i.e., a scrub bit), the next bit is a flag bit indicating whether the package is included (i.e., an included bit) in the VRU for performing a VBA read/write operation, the next bit indicating whether the package contains an IRU for which some or all of the MRUs have failed (i.e., a partially failed bit), and the final most significant bit indicating whether the package includes a complete (i.e., a spare bit) spare IRU (total 16 bits). Similarly, IRU's partially marked as failed and/or spare may not be used for a read/write operation.

As described above, the included flag bit of the CST entry 311 is indicative of whether or not a package will contain data for the VBA (i.e., read/write operation). For example, if the included flag bit value is "0" for a package, it will not contain data for the VBA read/write operation, and if the included flag bit value is "1" for a package, it will contain data for the VBA read/write operation (or vice versa). Out of the 24 packages on a media card, in an embodiment only 20 packages are used to perform the read/write operations, and 4 packages are spare packages for use as replacement of faulty packages by the media repair module 206. Since the 320 pages for storing a 5120 bytes size block of data is spread evenly across the memory system 102, during translation, the included flag bit of 20 packages will indicate that the corresponding package will contain data for the VBA read/write operation. Furthermore, each of the 20 packages will include 16 discrete pages (or beats) that will contain data to achieve an even distribution of data. As used, herein, the term beat is used to describe a page in a package that will contain data for performing a read/write operation corresponding to the received VBA. These 16 beats for each package may be identified using the MRT and the BART, as discussed below. As such, during translation, the upper 10 bits of the VBA are used to identify a VRU number, and corresponding included flag bit and IRU bits for each package.

Referring back to FIG. 3A, at step 304, for each package, the 9 IRU bits retrieved from the corresponding CST entry may be used to index into the MRT for that package. Specifically, for each of the 20 valid packages, the 9 IRU bits from the CST 310 are used to identify an IRU number (0-511), which is in turn used to index into the MRT 320.

As shown in FIG. 3B, the MRT 320 includes rows indexed by an IRU number and columns indexed by a beat number. Each entry 321 in the MRT 320 includes a total of 16 bits and determines the physical address of each beat on the package (total 16) that will contain data for performing the VBA read/write operation. The physical address is represented as a combination of die index (least significant 4 bits of the entry 321) in the package, the MRU group index (next 4 bits of the entry 321) in the die, and the MRU index (next 6 bits of the entry 321) in the MRU group that will include the beat (D/MG/M). Entry 321 also includes a failed bit (bit next to the most significant bit) indicating if the page represented by the D/MG/M has previously been declared as failed, and a spare bit indicating if the page represented by the D/MG/M has previously been declared as an individual spare (if the entire IRU is a spare, the MRUs will not be marked as spare in entry 321). Failed and/or spare pages may not be used for a read/write operation. The MRT 320 for each package, therefore, returns 16 physical addresses for beats in each package that may contain data for performing the read/write operation for the VBA.

As discussed above, an MRU includes 128 bit arrays out of which four are reserved as spare bit arrays, and each of the 1 million pages in the MRU takes 1 bit from each of the 124 remaining bit arrays. Therefore, at step 306, the BART 330 may be used to determine the indexes corresponding to the 124 bit arrays in each MRU of the above physical address from which the corresponding beat will take bits for performing the VBA read/write operation. As shown in FIG. 3B, each row of the BART 330 may be indexed using the D/MG/M identification from the MRT 320, and each column of the BART 330 is indexed by 0-3 since each MRU includes 4 unused bit arrays. Each entry 331 of the BART 330 includes 8 bits-7 least significant bits indicating one of the four unused bit arrays for the MRU of that row, and the most significant bit being reserved for future use. The 124 bit arrays from which bits will be taken by a beat may be determined by excluding the unused bit arrays from an MRU.

At step 308, the system may use the 20 least significant bits of the VBA in conjunction with the physical address (D/MG/M) and the unused bit array indexes to perform the read/write operation at the appropriate memory cells, where the actual read/write operation may be performed according to the interface specifications of each particular SCM memory technology.

It should be noted that the unused bit array indexes of the BART 330 may be determined using an ERT 340 created during a memory scrub process (described below with respect to FIG. 4). As shown in FIG. 3B, an ERT 340 of a package includes rows corresponding to 128 bit arrays and columns corresponding to MRUs in the package. Since one VRU is scrubbed at a time during the scrub process, the MRUs of the ERT 340 correspond to the VRU being scrubbed (discussed below). Furthermore, the scrub process described below targets 16 beats (i.e., MRUs) per package and updates an ERT for each package such that there are 16 MRUs in an ERT. Each entry 341 in an ERT includes the total number of stuck bits observed during a scrub process of a VRU. Since a VRU includes 1 million consecutive VBAs, the total number of stuck bits can be 2 million ((1 million stuck-at-0 and 1 million stuck-at-1, though not commonly both).

Figure 4:
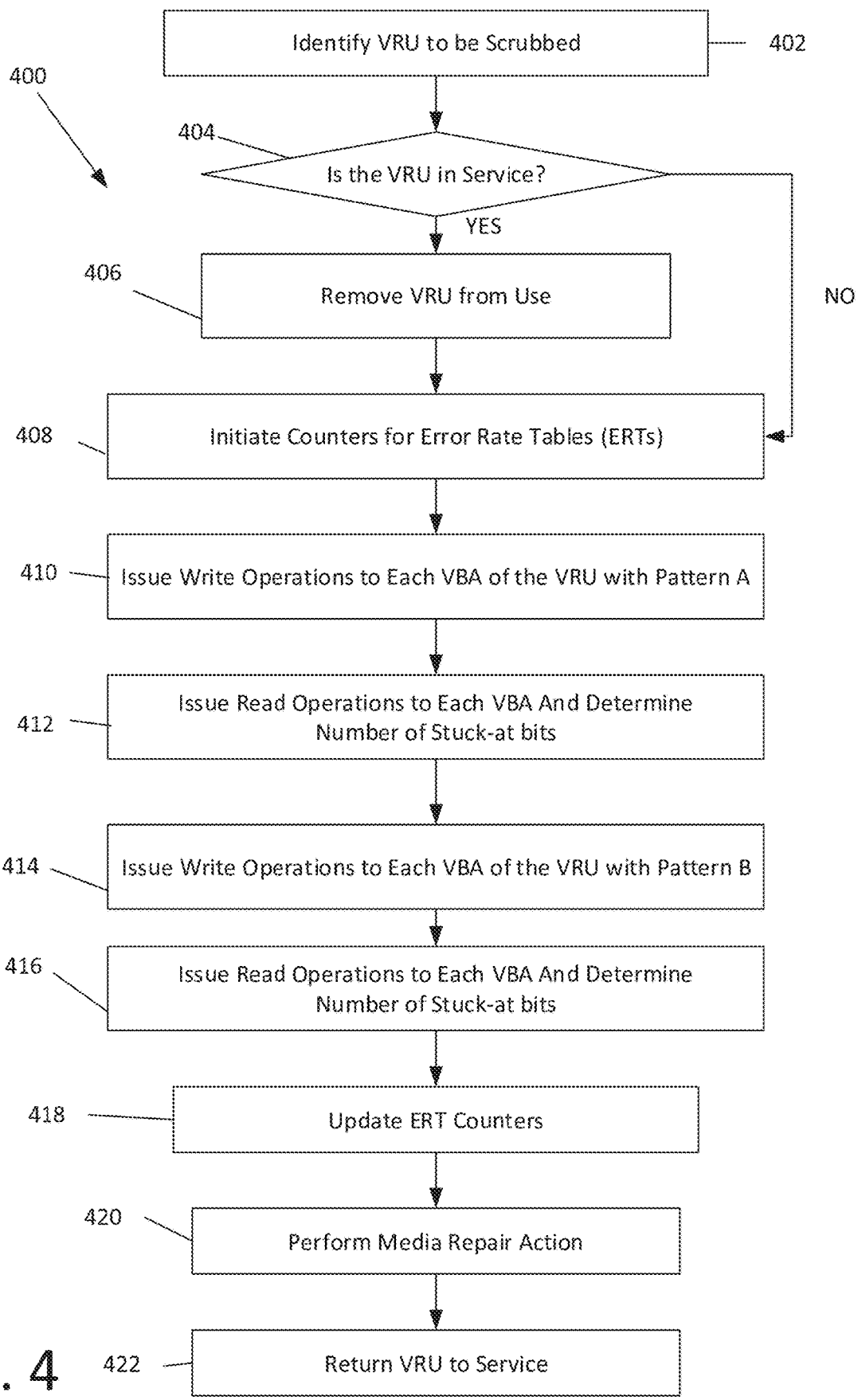
FIG. 4 is a flowchart illustrating an example method for a scrub process of the memory system of FIGS. 2A and 2B.

Referring now to FIG. 4, a flowchart illustrating an example scrub process of the memory system 102 is described. The scrub process may be performed for periodically rewriting data within a threshold period of time in order to ensure readability and accuracy of the data, for periodically inverting bits of the memory system to condition each memory cell for future programmability, and/or to test the memory system and gather statistics corresponding to stuck fault failures (which may in turn be used to initiate media repair actions). In certain embodiments, the scrub process may be performed on one VRU at a time (in a round robin manner and/or upon occurrence of a trigger event) by taking the 1 million consecutive VBAs corresponding to the VRU being scrubbed out of service by disabling any further read/write operations from the VRU.

During a scrub process, at 402, the system identifies a VRU to be scrubbed. In one or more embodiments, the scrub process for each VRU may be performed periodically and in a round robin manner (e.g., every 24 hours) and/or upon occurrence of a trigger event (e.g., detection of a memory error such as an asynchronization memory error, detection that a memory operation requires higher levels of ECC correction, or the like). The scrub process for the VRUs may be scheduled such that the complete memory system 102 may be scrubbed during a threshold period of time (e.g., 24 hours, 48 hours, or the like).

At 404, the system in one or more embodiments determines whether the identified VRU is in service for performing read/write operations. If the identified VRU is in service for performing read/write operations (404: YES), the system may remove the VRU from use (406). The removal of a VRU (e.g., 1 million consecutive VBAs from service) may include, without limitation, removal of all 1 million VBAs of the identified VRU from the Free Lists (that identify the free areas of memory of specific size needed) of the memory system. Specifically, the system may not allow any VBA of the VRU from being placed on a Free List after being released by a write operation. Additionally and/or alternatively, the system may also remove any existing data from all of the VBAs of the VRU currently in use for storing data by migrating the data to another location, removal of the VBAs from the logical-to-virtual (LVT) that keep track of current values of the VBA, and/or removal of the VBAs from the drift buffer.

Upon removal of the identified VRU from service and/or if the identified VRU is determined to be not in service for performing read/write operations (404: NO), the system may initialize (e.g., assign zero values) counters for all ERTs corresponding to the identified VRU at 408. At 410, the system may issue write operations for each VBA of the identified VRU with pattern A. Examples of pattern A may include a string of all 1's (to detect all stuck-at-0 bits), a string of all 0's (to detect all stuck-at-1 bits), all 5's (to detect two adjacent bits stuck to each other), and/or the like. Once the pattern A write operation has been executed for all VBAs in the VRU, the system may issue read operations for each VBA of the identified VRU to determine the number of stuck-at-fault bits in the VRU at 412. For example, if pattern A includes a string of all 1's, the read operation may be used to determine the stuck-at-0 bits in the VRU and if pattern A includes a string of all 0's, the read operation may be used to determine the stuck-at-1 bits in the VRU. Other patterns may be used to identify the number of other stuck faults in the VRU (e.g., stuck-at-X, 2 or more bits stuck to each other, etc.).

At 414, the system may issue write operations for each VBA of the identified VRU with pattern B, where pattern B is different from pattern A. Examples of pattern B may include a string of all 1's (to detect all stuck-at-0 bits), a string of all 0's (to detect all stuck-at-1 bits), all 5's (to detect two adjacent bits stuck to each other), and/or the like. Once the pattern B write operation has been executed for all VBAs in the VRU, the system may issue read operations for each VBA of the identified VRU to determine the number of stuck-at-fault bits in the VRU at 416. For example, if pattern A includes a string of all 1's and is used to identify stuck-at-0 bits in the VRU, pattern B may include a string of all 0's to determine the stuck-at-1 bits in the VRU.

It should be noted that during the scrub process of a VRU, all 128 bit arrays of each MRU (not just 124 bit arrays) of the VRU are written/read by ignoring the BART during the translation process such that stuck-at faults may be detected on every bit array. Specifically, the translations of each of the 1 million VBAs of a VRU to physical page addresses are performed using only the CST and the MRT. Furthermore, translations during the scrub process also includes the failed IRUs and/or spare IRUs. Each scrub process typically leads to the creation of 20-24 ERTs (for each package).

At 418, the system may update the ERT counters from step 408 based on the values of the determined stuck-at-0 bits and stuck-at-1 bits (i.e., update the counter to indicate the total number of stuck-at faults) for each bit array of each MRU of the VRU being scrubbed. At 420, the system may perform a media repair action (discussed below with respect to FIG. 5).

At 422, the system may return the VRU to service by, for example, inserting the 1 million VBAs of the VRU into the Free List. As discussed below, a VRU may not be returned to service if it is converted into spare IRUs during the media repair action.

Figure 5:
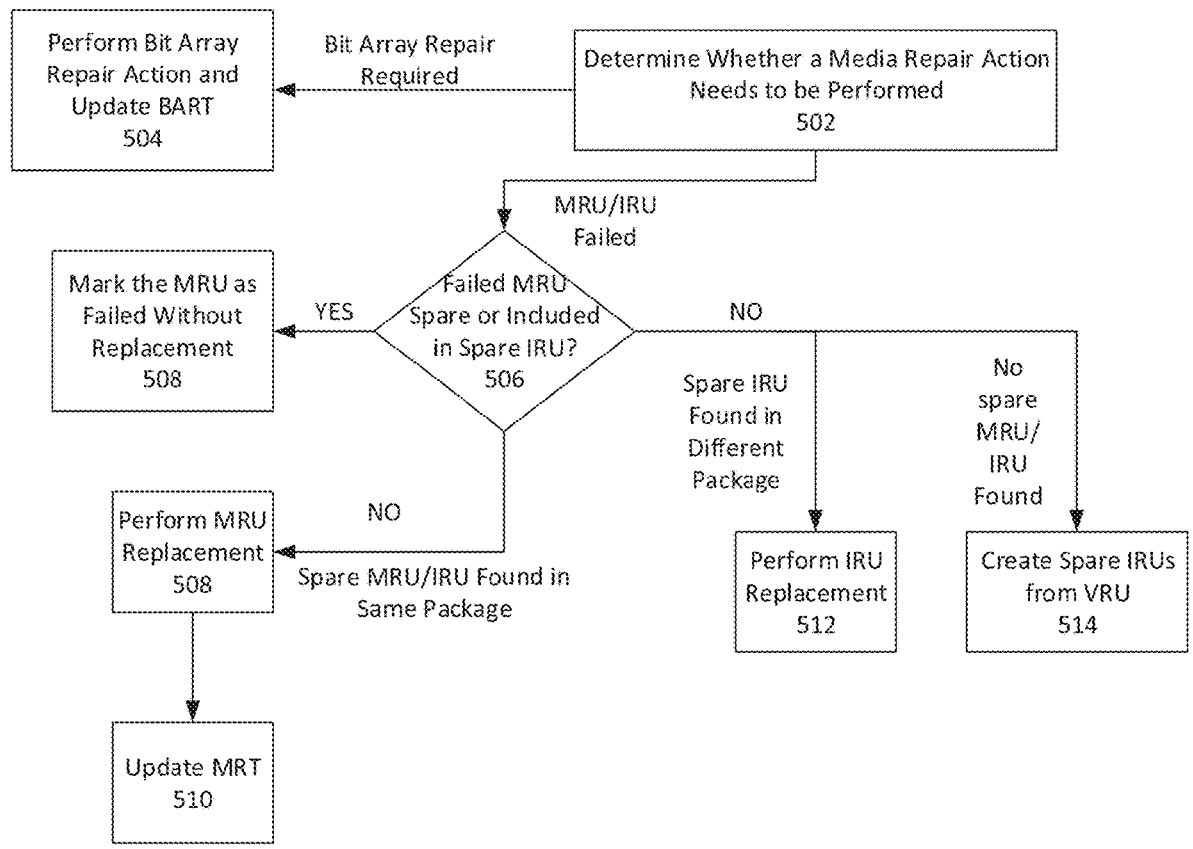
FIG. 5 is a flowchart illustrating an example method for memory repair action of the memory system of FIGS. 2A and 2B.

Referring now to FIG. 5, a flowchart illustrating an example media repair action performed during each scrub process of the memory system is described. As discussed above, during the scrub process, an ERT per package is constructed which indicates the number of stuck-at faults (e.g., stuck-at-1, stuck-at-0, etc.) for each of the bit array index/MRUs of the VRU being scrubbed. The system may analyze the counters in the ERT to perform a media repair action(s) as described in this FIG. 5. The media repair action may include bit array repair (almost always performed), MRU replacement, and/or IRU replacement.

At 502, the system may determine whether a bit array repair, an MRU replacement and/or an IRU replacement needs to be performed for the scrubbed VRU. In certain embodiments, the system may determine whether an MRU replacement and/or an IRU replacement needs to be performed for the VRU by identifying and analyzing the number of bad beats in the ERT.

A beat may be identified as a bad beat by analyzing the stuck-at bit counts for each of the bit arrays in the beat. Specifically, for each of the bit arrays of a beat, the system determines whether the number of stuck-at bit counts is greater than a first threshold ($T_H$), greater than a second threshold ($T_L$) but less than first threshold $T_H$, or is an acceptable number of stuck-at bits. The thresholds $T_L$ and $T_H$ are determined by the strength of the ECC. Example $T_H$ may be about 2000 to about 7000 bits per million bits, example $T_L$ may be about 200 to about 700 bits per million bits, and example acceptable number of stuck-at bits may be any value less than $T_L$ (e.g., less than 100 bits per million bits).

If no more than 4 beats have a number of stuck bits greater than $T_L$ (e.g., if a beat includes a 1 bit array having the number of stuck-at bit counts greater than $T_H$ and 3 bit arrays having the number of stuck-at bit counts greater than $T_L$), then the system may perform only bit array repair as discussed below. FIG. 6A illustrates an example ERT created after a VRU scrub that indicates a bit array repair is required.

Additionally and/or alternatively, if some beats (but not all and/or less than a threshold number) include more than 4 bit arrays having the number of stuck-at bit counts greater than $T_H$ and/or more than 11 bit arrays having the number of stuck-at bit counts greater than $T_L$, then the system may determine that the beat is a failed MRU. The system may perform MRU replacements for such failed MRUs in addition to bit array repair. FIG. 6B illustrates an example ERT created after a VRU scrub that indicates an MRU replacement is required.

If all or a certain threshold number of beats in an ERT for a package are bad (i.e., more than 4 bit arrays having the number of stuck-at bit counts greater than $T_H$ and/or more than 11 bit arrays having the number of stuck-at bit counts greater than $T_L$), then the system may determine that the IRU including the bad beats has failed. The system in one or more embodiments then performs IRU replacement for such failed IRUs in addition to bit array repair. An IRU replacement may also be performed if no spare MRUs exist in the package that includes the failed MRU that needs replacement. FIG. 6C illustrates an example ERT created after a VRU scrub that indicates an IRU replacement is required.

The numbers of bit arrays are provided as an example only and other numbers are within the scope of this disclosure for determining whether a bit array repair, an MRU replacement and/or an IRU replacement needs to be performed for VRU At 504, if a bit array repair is required, the system according to an aspect performs a bit array repair action by excluding the worst bit arrays from being used during a read/write operation. The system may first identify for each MRU in the ERT (i.e., column), the worst 4 bit arrays and their corresponding indexes by analyzing the total number of stuck-at faults observed for each bit array. The worst 4 bit arrays are bit arrays with the highest number of stuck-at-faults observed during the scrub process. The system may then update and save the BART corresponding to the ERT to include the worst 4 bit array indexes as the unused bit array indexes for that MRU. If more than 4 bit arrays are bad, the system may invoke an ECC to perform media repairs.

At 506, if an MRU/IRU replacement is required for a failed MRU, the system according to an aspect determines whether the failed MRU is a spare MRU and/or is included within a spare IRU. If the failed MRU is a spare MRU and/or is included within a spare IRU (506: YES), the system may mark the MRU as failed MRU (and not spare) without replacement (508). However, if the failed MRU is not a spare MRU and is not included within a spare IRU (506: NO), the system according to an embodiment performs an MRU replacement (508) and updates the MRT accordingly (510). It should be noted that a spare MRU may be considered as a candidate for replacement of a failed MRU only if performance of the MRU will not be degraded because performance degradation can result from the improper ordering of D/MG/M values within the beats of an IRU.

The system in an aspect performs MRU replacement (508) by first searching for spare MRUs in the same package as the failed MRU that need to be replaced. If no spare MRUs are found, the system in an embodiment also searches for spare IRUs in the same package and divides the spare IRU into spare MRUs. The spare MRU and/or IRU in the same package can then be used to replace the failed MRU and/or the IRU including the failed MRU. The system in an embodiment converts the good MRUs (i.e., MRUs that don't need replacement) of the IRU being replaced to spare MRUs. Upon replacement, in one or more embodiments, the system updates the MRT for that package to swap the physical addresses of pages in the failed MRU or IRU (i.e., the D/MG/G) with that of the spare MRU or IRU.

However, if the package including the failed MRU does not include spare MRUs or IRUs, then in one or more embodiments the system replaces (512) the whole IRU with a spare IRU in another package. The system according to an aspect converts the good MRUs (i.e., MRUs that don't need replacement) of the IRU being replaced to spare MRUs. Upon replacement, the system, in an embodiment, updates the CST to swap the IRU in-use with the spare IRU as well as the spare/failed IRU indications in the CST. It should be noted that in an embodiment a spare IRU from the same package as the failed MRU/IRU is preferred over a spare IRU from another package for replacement.

If the system cannot find any spare MRUs or IRUs in any of the packages, in one or more embodiments it creates (514) spare IRUs from the VRU being scrubbed (and not return it into service), and marks the failed MRU as failed. The system updates the CST and the MRT in an aspect to indicate that the VRU has been used to create spare IRUs and cannot be used for read/write operations.

While the illustrative embodiments described above are preferably implemented in hardware, such as in units and circuitry of a processor, various aspects of the illustrative embodiments and/or techniques may be implemented in software as well. For example, it will be understood that each block of the flowchart illustrations in FIGS. 3-5, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions, and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

One or more embodiments of the present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

The corresponding structures, materials, acts, and equivalents of all means or step plus function elements in the claims below are intended to include any structure, material, or act for performing the function in combination with other claimed elements as specifically claimed. The description of the embodiments of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiments and examples were chosen and described in order to best explain the principles of the disclosure and the practical application, and to enable others of ordinary skill in the art to understand the disclosure for various embodiments with various modifications as are suited to the particular use contemplated.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for collecting diagnostic data from a storage class memory chip, the method comprising:
    performing a scrub process on at least a portion of the storage class memory by:
        removing a portion of the storage class memory from active use for memory access operations, wherein the portion comprises a plurality of memory locations;
        executing, while the portion of storage class memory is removed from active use for memory access operations, a first write operation to write a first pattern on each of the plurality of memory locations;
        executing, while the portion of storage class memory is removed from active use for memory access operations, a first read operation to obtain a first set of data written on each of the plurality of memory locations;
        analyzing the first set of data written on each of the plurality of memory locations to determine a number of stuck-at faults in the portion removed from active use for memory access operations; and
        updating, in response to determining the number of stuck-at faults in the portion removed from active use for memory access operations, one or more counters in an error rate table (ERT) to indicate the number of stuck-at faults; and
        determining, based upon the number of stuck-at faults updated in the one or more counters in the error rate table (ERT), whether to return one or more of the plurality of memory locations back to service for active use for memory access operations.

2. The method of claim 1, wherein performing the scrub process further comprises:
    executing, while the portion of storage class memory is removed from active use for memory access operations, a second write operation to write a second pattern on each of the plurality of memory locations, wherein the first pattern and the second pattern are different from each other;
    executing, while the portion of storage class memory is removed from active use for memory access operations, a second read operation to obtain a second set of data written on each of the plurality of memory locations;
    analyzing the second set of data written on each of the plurality of memory locations to determine the number of stuck-at faults in the portion removed from active use for memory access operations; and
    updating, in response to determining the number of stuck-at faults in the portion removed from active use for memory access operations, one or more counters in the error rate table (ERT) to indicate the number of stuck-at faults.

3. The method of claim 2, wherein the first pattern is one of a repeating string of 1's or a repeating string of 0's and the second pattern is another different one of the repeating string of 0's or the repeating string of 1's.

4. The method of claim 2, wherein the stuck-at faults comprise at least one of the following: stuck-at-0, stuck-at-1, stuck-at-X, or at least two bits stuck together.

5. The method of claim 1, wherein removing the portion of the storage class memory from active use for memory access operations comprises removing the portion from a Free List corresponding to the storage class memory.

6. The method of claim 1, wherein removing the portion of the storage class memory from active use for memory access operations comprises transferring data stored on the portion of the storage class memory to a second portion of the storage class memory.

7. The method of claim 1, wherein the plurality of memory locations in the portion of the storage class memory are addressable by a threshold number of consecutive virtual block addresses of the storage class memory and wherein each of the plurality of memory locations comprises a plurality of bit arrays.

8. The method of claim 1, wherein each of the plurality of memory locations comprises a plurality of bit arrays and the ERT comprises counters for counting stuck-at faults corresponding to each of the plurality of bit arrays for each of the plurality of memory locations.

9. The method of claim 8, further comprising, analyzing the ERT to identify one or more of the plurality of bit arrays not to be used for performing read/write operations, wherein the one or more of the plurality of bit arrays not to be used for performing read/write operations have counter values for the number of stuck-at faults greater than a threshold value.

10. The method of claim 9, wherein the identified one or more of the plurality of bit arrays not to be used for performing read/write operations are not returned to service for active use for memory access operations, and the remainder of the one or more of the plurality of bit arrays in the portion of the storage class memory are returned to service for active use for memory access operations after the scrub process.

11. The method of claim 1, further comprising returning the portion of the storage class memory into service for active use during read/write operations after the scrub process.

12. A computing system for collecting diagnostic data from a storage class memory chip, the system comprising:
    a processor; and
    a computer readable storage medium comprising programming instructions that when executed cause the processor to:
        perform a scrub process on at least a portion of a storage class memory by:
            removing a portion of the storage class memory from active use for memory access operations, wherein the portion comprises a plurality of memory locations;
            executing a first write operation to write a first pattern on each of the plurality of memory locations;

executing a first read operation to obtain a first set of data written on each of the plurality of memory locations;

analyzing the first set of data written on each of the plurality of memory locations to determine a number of stuck-at faults in the portion removed from active use for memory access operations;

update, in response to determining the number of stuck-at faults in the portion removed from active use for memory access operations, one or more counters in an error rate table (ERT) to indicate the number of stuck-at faults; and determining, based upon the number of stuck-at faults updated in the one or more counters in the error rate table (ERT), whether to return one or more of the plurality of memory locations back to service for active use for memory access operations.

13. A computing system of claim 12, wherein the programming instructions to cause the processor to perform the scrub process further comprise programming instructions to cause the processor to perform the scrub process by:

executing a second write operation to write a second pattern on each of the plurality of memory locations, wherein the first pattern and the second pattern are different from each other;

executing a second read operation to obtain a second set of data written on each of the plurality of memory locations;

analyzing the second set of data written on each of the plurality of memory locations to determine the number of stuck-at faults in the portion removed from active use for memory access operations; and updating, in response to determining the number of stuck-at faults in the portion removed from active use for memory access operations, one or more counters in the error rate table (ERT) to indicate the number of stuck-at faults.

14. The computing system of claim 13, wherein the first pattern is one of a repeating string of 1's or a repeating string of 0's and the second pattern is another different one of the repeating string of 0's or the repeating string of 1's.

15. The computing system of claim 13, wherein the stuck-at faults comprise at least one of the following: stuck-at-0, stuck-at-1, stuck-at-X, or at least two bits stuck together.

16. The computing system of claim 12, wherein the programming instructions to cause the processor to perform the scrub process by removing the portion of the storage class memory from active use for memory access operations comprise programming instructions to cause the processor to perform the scrub process by removing the portion from a Free List corresponding to the storage class memory.

17. The computing system of claim 12, wherein the programming instructions to cause the processor to perform the scrub process by removing the portion of the storage class memory from active use for memory access operations comprise programming instructions to cause the processor to perform the scrub process by transferring data stored on the portion of the storage class memory to a second portion of the storage class memory.

18. The computing system of claim 12, wherein the plurality of memory locations in the portion of the storage class memory are addressable by a threshold number of consecutive virtual block addresses of the storage class memory and wherein each of the plurality of memory locations comprise a plurality of bit arrays.

19. The computing system of claim 12, wherein each of the plurality of memory locations comprises a plurality of bit arrays and the ERT comprises counters for counting stuck-at faults corresponding to each of the plurality of bit arrays for each of the plurality of memory locations.

20. The computing system of claim 12, wherein the programming instructions to cause the processor to perform the scrub process further comprise programming instructions to cause the processor to perform the scrub process by:

analyzing the ERT to identify one or more of a plurality of bit arrays not to be used for performing memory access operations, wherein the one or more of the plurality of bit arrays not to be used to perform memory access operations have counter values for the number of stuck-at faults greater than a threshold value, and the one or more of the plurality of bit arrays identified not to be used for performing memory access operations are not returned to service for active use for memory access operations; and the remained of the one or more of the plurality of bit arrays are returned to service for active use in memory access operations after the scrub process.

* * * * *